(12) United States Patent
Tsai

(10) Patent No.: US 6,591,395 B1
(45) Date of Patent: Jul. 8, 2003

(54) MEMORY REDUCTION TECHNIQUES IN A VITERBI DECODER

(75) Inventor: Shang-Ho Tsai, KaoShiung Hsien (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 433 days.

(21) Appl. No.: 09/596,314

(22) Filed: Jun. 18, 2000

(51) Int. Cl.$^7$ ............................................. H03M 13/41
(52) U.S. Cl. ...................... 714/795; 375/341; 714/794; 714/796; 714/792
(58) Field of Search ............................... 714/792, 795, 714/796, 794; 375/341

(56) References Cited

U.S. PATENT DOCUMENTS

| | | | | |
|---|---|---|---|---|
| 4,583,078 A | * | 4/1986 | Shenoy et al. | 341/51 |
| 4,709,377 A | * | 11/1987 | Martinez et al. | 375/265 |
| 4,713,817 A | * | 12/1987 | Wei | 714/758 |
| 5,418,798 A | * | 5/1995 | Wei | 714/792 |
| 5,465,275 A | * | 11/1995 | Blaker et al. | 375/341 |
| 5,490,178 A | * | 2/1996 | Blaker et al. | 375/341 |
| 5,550,870 A | * | 8/1996 | Blaker et al. | 375/341 |
| 5,937,015 A | * | 8/1999 | Dent et al. | 375/341 |
| 5,970,097 A | * | 10/1999 | Ishikawa et al. | 375/262 |
| 6,088,404 A | * | 7/2000 | Jekal | 375/341 |
| 6,345,073 B1 | * | 2/2002 | Curry et al. | 375/265 |
| 6,460,161 B1 | * | 10/2002 | Crozier et al. | 714/795 |

OTHER PUBLICATIONS

T.K Truong, "VLSI Design for A Trace–back Viterbi Decoder", Mar. 1992, IEEE Transactions on Communications, vol. 40, No. 3, pp. 616–624.*
Charles H. Roth, "Fundamentals of Logic Design", West Publishing Company, 4th Edition, p. 223–226.*
M. Boo et al., "Mapping of The Viterbi Algoritm Onto Area–Efficient Vlsi Architecture", 1997, NEC Research Index.*
Samir Palnitkar, "Verilog HDL", 1996, Prentice Hall, pp. 3–9, 275–317.*
Trellis–Coded Modulation with Multidimensional Constellations, Jul., 1987, Lee–Fang Wei, Member, IEEE.
A VLSI Design for a Trace–Back Viterbi Decoder, Mar., 1992, T.K. Truong, Senior Member, IEEE.

* cited by examiner

*Primary Examiner*—Albert DeCady
*Assistant Examiner*—William P Moore

(57) ABSTRACT

A simple combinational logic circuit processes trace-back procedures for a Viterbi decoder instead of using ROM. The circuit includes a multiplexer, a shifter and an adder. A trace-back value is generated according to the trace-back information of a current state. The state value of the current state is shifted right by 2 bits. The shifted value and the trace-back value are added to obtain the state value of its prior state. 4-D symbols associated with each state transitions in all survivors for trace-back procedure are represented by 2-D symbols along with the differences between their coordinates.

6 Claims, 19 Drawing Sheets

| state \ iteration | 1 | 2 | 3 | 4 | 5 |
|---|---|---|---|---|---|
| 0 | 0 | 0 | 1 | 3 | 2 |
| 1 | 0 | 0 | 1 | 3 | 0 |
| 2 | 0 | 0 | 1 | 3 | 3 |
| 3 | 0 | 0 | 1 | 3 | 1 |
| 4 | x | 0 | 2 | 3 | 2 |
| 5 | x | 0 | 0 | 3 | 2 |
| 6 | x | 0 | 3 | 3 | 2 |
| 7 | x | 0 | 1 | 3 | 2 |
| 8 | x | 0 | 3 | 3 | 2 |
| 9 | x | 0 | 3 | 3 | 2 |
| A | x | 0 | 3 | 3 | 2 |
| B | x | 0 | 3 | 3 | 2 |
| C | x | 0 | 1 | 3 | 0 |
| D | x | 0 | 1 | 1 | 0 |
| E | x | 0 | 1 | 2 | 0 |
| F | x | 0 | 1 | 0 | 0 |

| 4-D Coset | 2-D Cosets $V \quad W$ |
|---|---|
| $C_4^0$ | $C_2^0 \times C_2^0$<br>$C_2^3 \times C_2^3$ |
| $C_4^4$ | $C_2^0 \times C_2^3$<br>$C_2^3 \times C_2^0$ |
| $C_4^2$ | $C_2^2 \times C_2^2$<br>$C_2^1 \times C_2^1$ |
| $C_4^6$ | $C_2^2 \times C_2^1$<br>$C_2^1 \times C_2^2$ |
| $C_4^1$ | $C_2^0 \times C_2^2$<br>$C_2^3 \times C_2^1$ |
| $C_4^5$ | $C_2^0 \times C_2^1$<br>$C_2^3 \times C_2^2$ |
| $C_4^3$ | $C_2^2 \times C_2^0$<br>$C_2^1 \times C_2^3$ |
| $C_4^7$ | $C_2^2 \times C_2^3$<br>$C_2^1 \times C_2^0$ |

FIG. 8

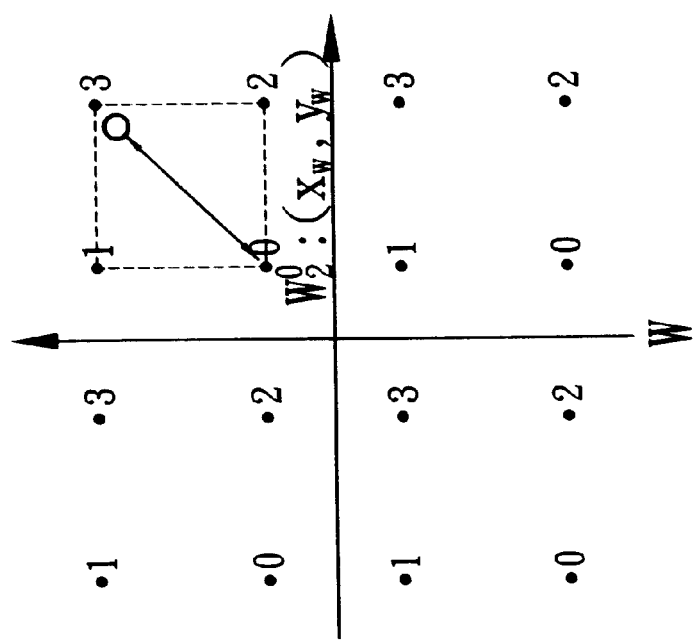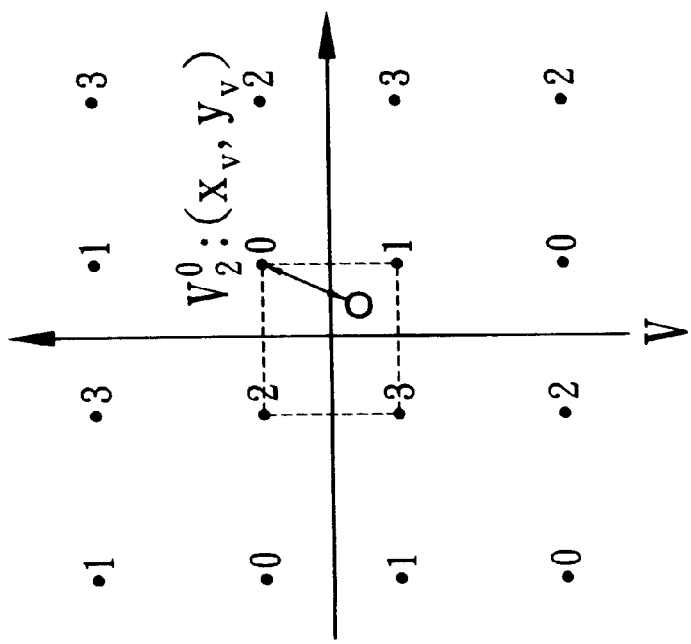
FIG. 9

| 4-D Coset | 2-D Cosets |
|---|---|
| $C_4^0$ | $(x_v, y_v) \times (x_w, y_w)$<br>$(x_v-2, y_v-2) \times (x_w+2, y_w+2)$ |
| $C_4^4$ | $(x_v, y_v) \times (x_w+2, y_w+2)$<br>$(x_v-2, y_v-2) \times (x_w, y_w)$ |
| $C_4^2$ | $(x_v-2, y_v) \times (x_w+2, y_w)$<br>$(x_v, y_v-2) \times (x_w, y_w+2)$ |
| $C_4^6$ | $(x_v-2, y_v) \times (x_w, y_w+2)$<br>$(x_v, y_v-2) \times (x_w+2, y_w)$ |
| $C_4^1$ | $(x_v, y_v) \times (x_w+2, y_w)$<br>$(x_v-2, y_v-2) \times (x_w, y_w+2)$ |
| $C_4^5$ | $(x_v, y_v) \times (x_w, y_w+2)$<br>$(x_v-2, y_v-2) \times (x_w+2, y_w)$ |
| $C_4^3$ | $(x_v-2, y_v) \times (x_w, y_w)$<br>$(x_v, y_v-2) \times (x_w+2, y_w+2)$ |
| $C_4^7$ | $(x_v-2, y_v) \times (x_w+2, y_w+2)$<br>$(x_v, y_v-2) \times (x_w, y_w)$ |

FIG. 10

| iteration | 1 | 2 | 3 | 4 | 5 |
|---|---|---|---|---|---|
| Real part of V | -3 | -1 | 1 | 3 | 3 |
| Imaginary part of V | 3 | -3 | -1 | 3 | 1 |
| Real part of W | 1 | -1 | -1 | -1 | 3 |
| Imaginary part of W | 3 | 3 | -1 | -1 | 1 |

FIG. 11

| 4-D Coset | 2-D Cosets V W | 2-D Cosets V W | Entrance metrics of $(-3,3)\times(1,3)$ | Survival 4-D symbols for each coset | Location information relative to $C_2^0 \times C_2^0$ |
|---|---|---|---|---|---|
| $C_4^0$ | $C_2^0 \times C_2^0$<br>$C_2^3 \times C_2^3$ | $(-3,1)\times(1,1)$<br>$(-1,3)\times(3,3)$ | 8<br>8 | $(-3,1)\times(1,1)$ | $(00,00)\times(00,00)$ |
| $C_4^4$ | $C_2^0 \times C_2^3$<br>$C_2^3 \times C_2^0$ | $(-3,1)\times(3,3)$<br>$(-1,3)\times(1,1)$ | 8<br>8 | $(-3,1)\times(3,3)$ | $(00,00)\times(01,01)$ |
| $C_4^2$ | $C_2^2 \times C_2^2$<br>$C_2^1 \times C_2^1$ | $(-1,1)\times(3,1)$<br>$(-3,3)\times(1,3)$ | 16<br>0 | $(-3,3)\times(1,3)$ | $(00,01)\times(00,01)$ |
| $C_4^6$ | $C_2^2 \times C_2^1$<br>$C_2^1 \times C_2^2$ | $(-1,1)\times(1,3)$<br>$(-3,3)\times(3,1)$ | 8<br>8 | $(-1,1)\times(1,3)$ | $(01,00)\times(00,01)$ |
| $C_4^1$ | $C_2^2 \times C_2^2$<br>$C_2^3 \times C_2^1$ | $(-3,1)\times(3,1)$<br>$(-1,3)\times(1,3)$ | 12<br>4 | $(-1,3)\times(1,3)$ | $(01,01)\times(00,01)$ |
| $C_4^5$ | $C_2^0 \times C_2^1$<br>$C_2^3 \times C_2^2$ | $(-3,1)\times(1,3)$<br>$(-1,3)\times(3,1)$ | 4<br>12 | $(-3,1)\times(1,3)$ | $(00,00)\times(00,01)$ |
| $C_4^3$ | $C_2^2 \times C_2^0$<br>$C_2^1 \times C_2^3$ | $(-1,1)\times(1,1)$<br>$(-3,3)\times(3,3)$ | 12<br>4 | $(-3,3)\times(3,3)$ | $(00,01)\times(01,01)$ |
| $C_4^7$ | $C_2^2 \times C_2^3$<br>$C_2^1 \times C_2^0$ | $(-1,1)\times(3,3)$<br>$(-3,3)\times(1,1)$ | 12<br>4 | $(-3,3)\times(1,1)$ | $(00,01)\times(00,00)$ |

FIG. 13

MEMORY REDUCTION TECHNIQUES IN A VITERBI DECODER

FIELD OF THE INVENTION

The present invention relates to a Viterbi decoder, and more particularly to the memory reduction techniques for a Viterbi decoder of Trellis-coded modulation.

BACKGROUND OF THE INVENTION

Trellis-coded modulation/demodulation has been widely used in many communication systems to improve system performance. It has been shown that the trellis-coded modulation scheme using two-dimensional (2-D) constellations can improve the error performance of synchronous data links without sacrificing data rate or requiring more bandwidth.

Trellis-coded modulation schemes using 4-D constellations have also been reported in recent years. In a paper titled "Trellis-Coded Modulation with Multidimensional Constellations" published in IEEE Transactions on Information Theory, Vol. IT-33, No. 4, July 1987, a number of modulation schemes have been presented and evaluated by Lee-Fan Wei. How to select multi-dimensional constellations, partition them into subsets and construct trellis codes using these subsets as well as how to map bits to constellation points have been discussed in the paper.

Wei's 16-state 4 dimensional (4-D) trellis code has been adopted by ADSL standards such as TIE1.4 and G.DMT as an option. FIG. 1 shows a trellis diagram of 16-state codes with 4-D constellation. There are 16 states and four branches enter each state. As a result, a total of 64 transitions exist.

A Viterbi decoder may be used as a decoder of Wei's 16 state 4-D trellis-code. The basic operation of the Viterbi decoder is to select the most likely symbol from the 4-D cosets in Wei's construction based on a long sequence of received data. Whenever a newly received data is available, several candidates (surviving paths or survivors) are extended and compared with the received data sequence., and the data associated with the best survivor is chosen as the most likely one.

FIG. 2 illustrates the block diagram of a typical Viterbi decoder using a trace-back method. As shown in the block diagram, for each received 4-D signal a branch metric unit 101 computes the branch metrics associated with the 64 transitions. The branch metric associated with each transition is measured in terms of Euclidean distance between the received signal and a symbol in the 4-D cosets that is closet to the received signal. An add-and-compare selector (ACS) 102 determines the survival path for each of the 16 states. A memory unit 103 stores the 4-D symbols as well as the trace-back information for all branches in all the surviving paths that reach the 16 states. A trace-back unit 104 is used to implement the trace-back operation.

As can be seen from FIG. 2, significant memories are required in the decoding process to store the trace-back information as well as the 4-D symbols associated with all the state transitions in each survival path. Assuming a track-back length of 20, the size of the required memory that saves the survival 4-D symbols of each state is 16×20×8×4 bits. In the conventional implementation, redundant information is stored if the 4-D symbols associated with all state transitions that are selected from the cosets are stored in their original format.

The most commonly used implementation for the trace-back unit 104 is a ROM device which saves the trace-back information as shown in FIG. 3 for a 16-state Wei's code. As can be seen from FIG. 3, a ROM of size 16×16×2 bits is required because 2 bits are needed to represent the trace-back information {0, 1, 2, 3} that denotes four possible survivors leading to a specific state.

From the forgoing discussion, it is understandable that there is strong need in improving the conventional implementation of a Viterbi decoder of trellis-coded modulation so as to provide more efficient as well as lower cost decoders.

SUMMARY OF THE INVENTION

The present invention has been made to improve the above-mentioned drawbacks of a conventional Viterbi decoder of trellis-coded modulation. The primary object of the invention is to provide mechanisms for reducing memory requirement in the conventional Viterbi decoder. Accordingly, the invention proposes a simple combinational logic circuit to replace the implementation using ROM and an information storage mechanism that helps to reduce the required memory used for storing all the 4-D symbols associated with each state transitions in all survivors for trace-back procedure.

It is also an object of the invention to provide a combinational logic circuit for processing trace-back operation of a Vierbi decoder instead of using a ROM. According to the present invention, the combinational circuit comprises a four-input and one-output multiplexer, a shifter and an adder. The multiplexer provides a trace-back value according to the trace-back information of a state and the shifter shifts the state value towards right by two bits. The trace-back value and shifted value are added together to get the state value of the prior state.

Another object of the invention is to provide a mechanism for reducing the size of the memory storing 4-D symbols of the trace-back information. A 4-D coset is rewritten as a union of two Cartesian product of two 2-D cosets. All the symbols in the eight 4-D cosets closest to a received signal can be represented by symbols from two 2-D cosets along with differences between their coordinates.

BRIEF DESCRIPTION OF THE DRAWINGS

FIG. 4 shows an example of the memory that memorizes the trace-back information in a Viterbi decoder after iteration 5.

FIG. 5 shows the trace-back procedure and the traced-back state after each iteration.

FIG. 8 shows that each 4-D coset in Wei's code can be rewritten as the union of two Cartesian product of two 2-D cosets in V and W coordinate systems.

FIG. 9 shows that the two 2-D symbols in the coset $C_2^0 \times C_2$ closest to the received signal symbol are $V_2^0 \times W_2^0$ whose coordinates are given by $(x_v, y_v) \times (x_w, y_w)$.

FIG. 10 shows the symbol in each of the eight 4-D cosets that is closet to the received signal.

FIG. 11 shows an example of five 4-D symbols received and input to the Trellis decoder according to this invention.

FIG. 13 shows all the entrance metrics of all state transitions when the first symbol of the example of FIG. 11 is received at iteration 1.

DESCRIPTION OF THE PREFERRED EMBODIMENTS

Figure 3:
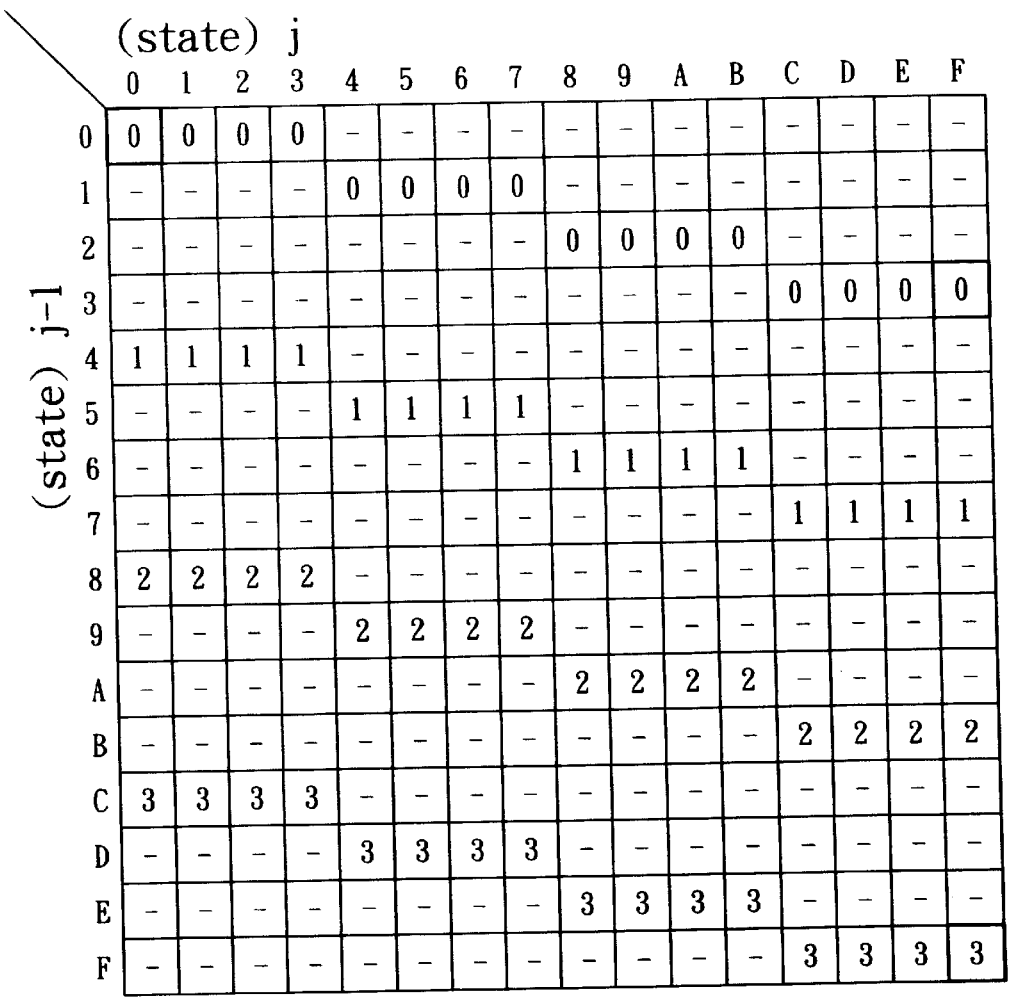
FIG. 3 shows the state transition relationship between all 16 states in the 16-state 4-D Wei's trellis codes.

With reference to FIG. 3, the state transition relationship between all 16 states in the 16-state 4-D Wei's trellis codes is shown. In the implementation of a Viterbi decoder, the trace-back information indicated by {0,1, 2, 3} is stored in a trace-back memory to denote the four possible survivor paths from prior states at iteration j−1 to the current state (at iteration j). Only one of these four paths survives to each state after the compare-and-select operation in the Viterbi decoding process.

Assuming that the trace-back length in the Viterbi decoder is equal to 5, after 5 iterations the memory that memorizes the trace-back information is as shown in FIG. 4. One must first find the smallest survivor, i.e., the survivor with the smallest accumulated metric at iteration 5 in order to get the first most likely 4-D symbol at 5 iterations ago. Assuming the survivor is the one that reaches state 9 at iteration 5, the trace-back information in state 9 is 2 for this example as shown in FIG. 4. From FIG. 3, the prior state at iteration 4 on the surviving path that reaches state 9 is state A. At iteration 4, the trace-back information in state A is 3 and leads to state E at iteration 3 on the same surviving path.

Figure 5:
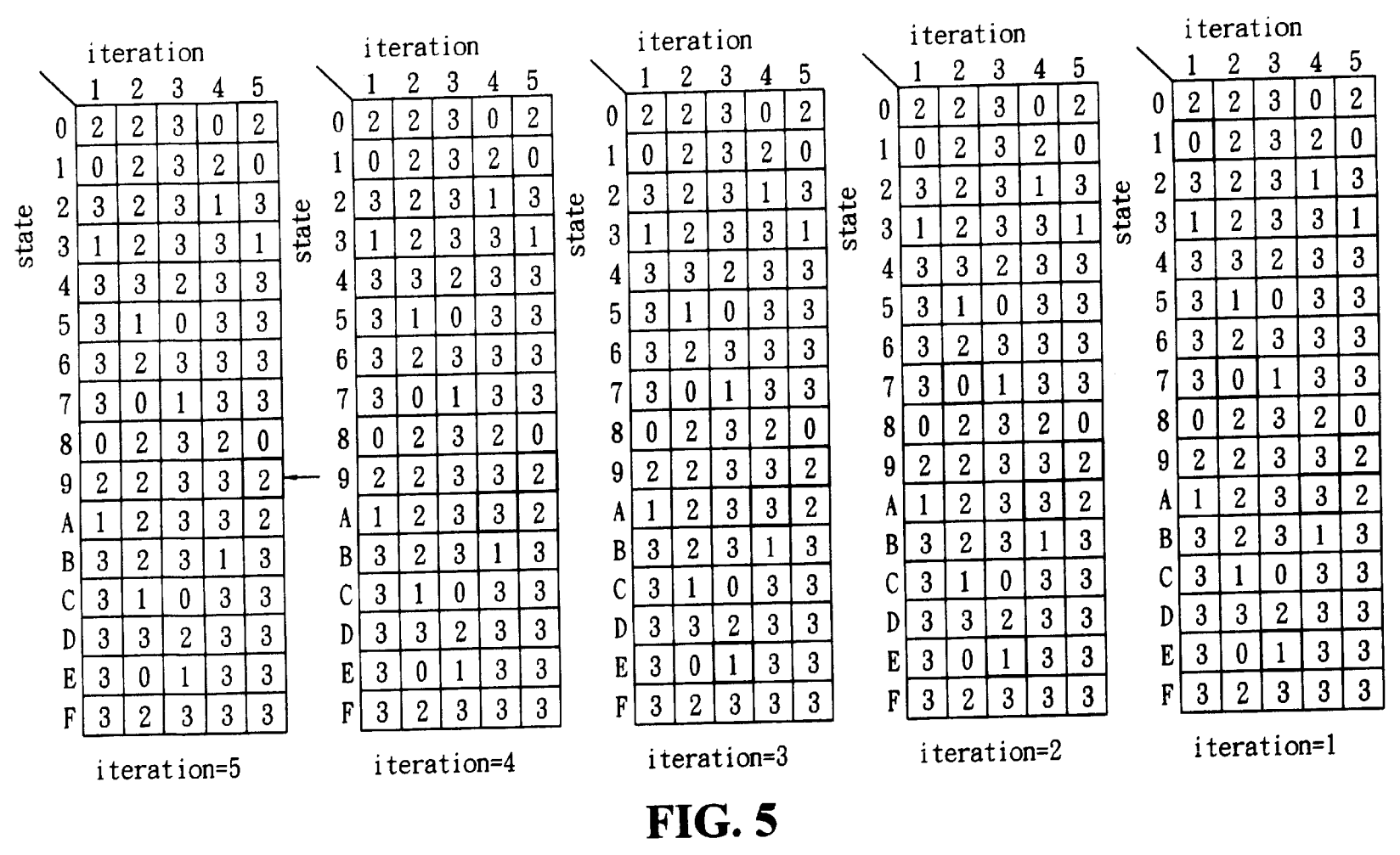
Figure 6:
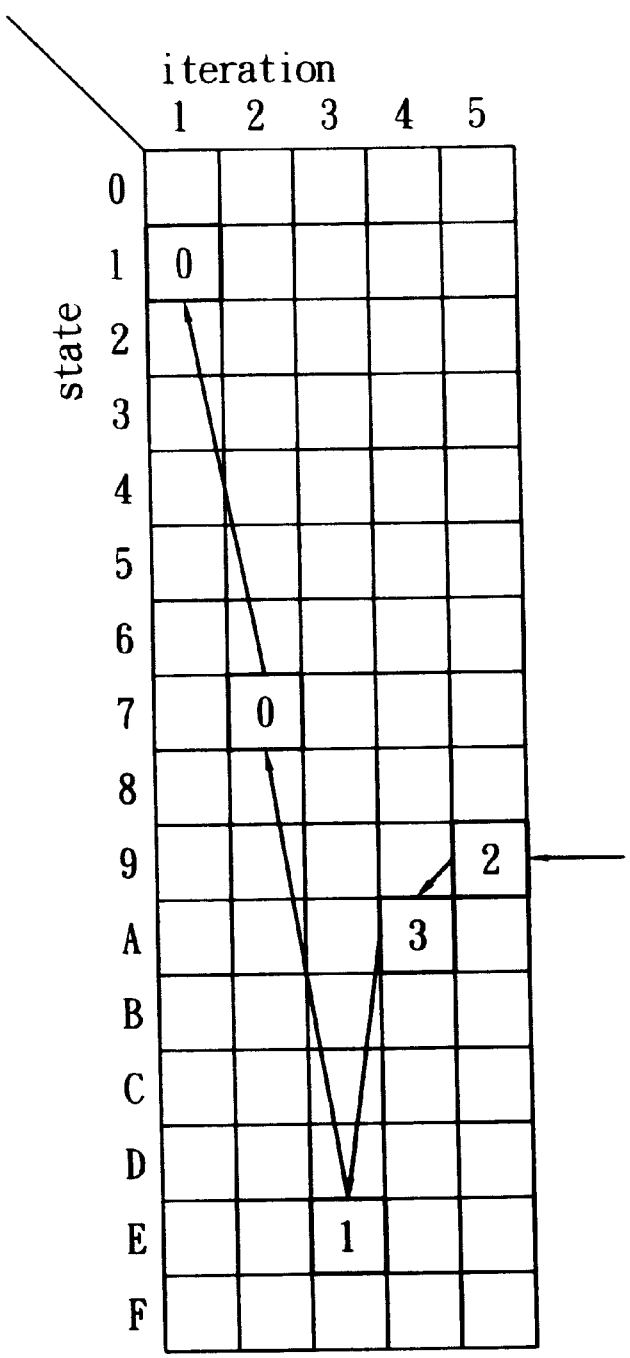
FIG. 6 shows the survivor path of the example of FIG. 4.

The above procedure repeats until state 1 at iteration 1 is reached eventually. FIG. 5 illustrates this track-back procedure. The survivor path found in this example is shown in FIG. 6. To implement the state transition relationship like the one in FIG. 3 for 16-state Wei's codes, a ROM of size 16×16×2 bits is required because 2 bits are needed to represent the trace-back information {0, 1, 2, 3} that decodes four possible survivors leading to a specific state.

Figure 7:
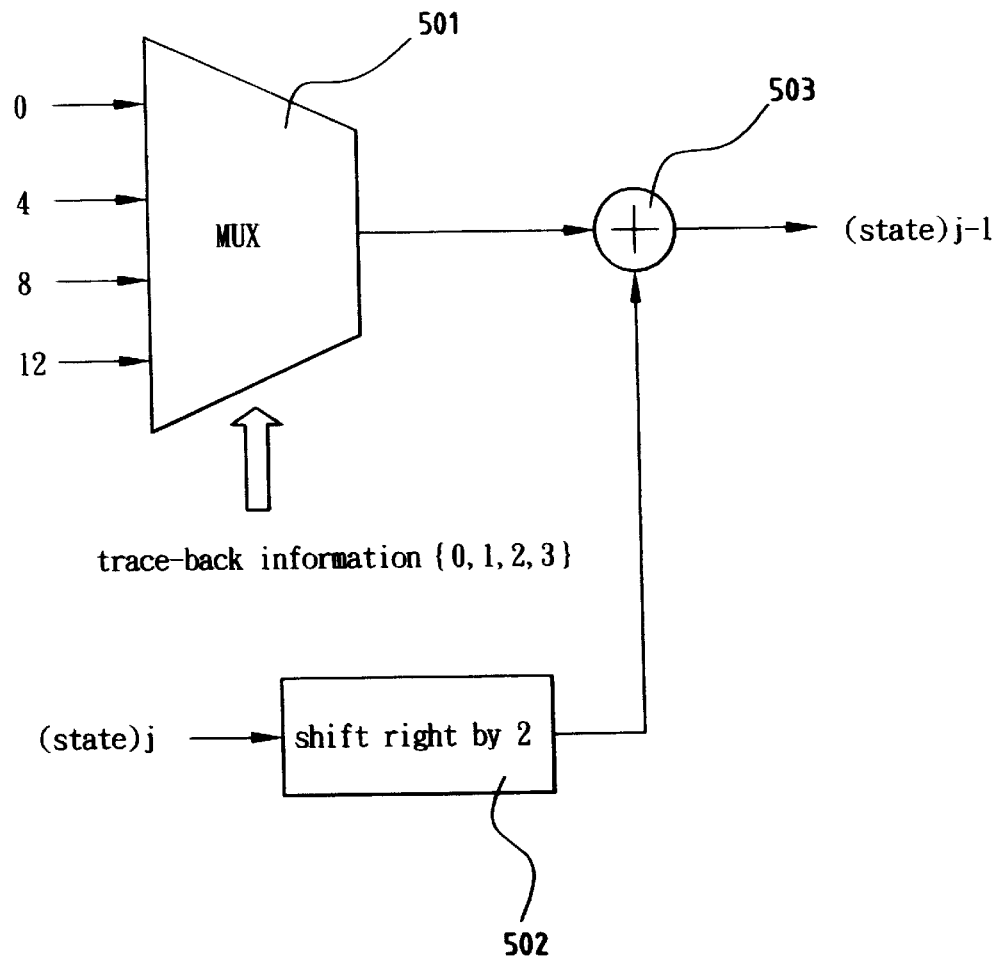
FIG. 7 shows a preferred embodiment of the memory reduction techniques comprising a combinational logic circuit for processing the track-back procedure.

According to a preferred embodiment of this invention, a simple combinational logic circuit instead of a ROM is used to implement the relationship described in FIG. 3. FIG. 7 shows a block diagram of the combinational logic circuit that comprises a multiplexer 501, a shifter 502 and an adder 503. The multiplexer 501 is controlled by the trace-back information {0, 1, 2, 3}. The outputs of the multiplexer 501 are 0, 4, 8, 12 for the trace-back information 0, 1, 2, 3 respectively. The shifter 502 shifts the bit value representing the current state j to the right by 2 bits. The shifted value is then added to the output of the multiplexer 501 by the adder 503 to obtain the value representing the prior state j−1.

For the example just described above, the trace-back information in state 9 is 2 at iteration 5. Using the combinational logic circuit as shown in FIG. 7, the multiplexer 501 has an output value 8 and the output value of the shifter 502 is 2. Consequently, the combinational logic circuit obtains an output value 10 for the prior state at the output of the adder 503. At iteration 4, the trace-back information in state 10 is 3 which causes the multiplexer 501 to generate an output value 12. After shifting 2 bits to the right by the shifter 502, a value of 2 is obtained from the state value of 10. Therefore, the combinational logic circuit obtains an output value 14 for the prior state at the output of the adder 503. Repeating the operation just described, at iteration 1, it can be determined that the combinational logic circuit traces back to state 1 at iteration 1.

From the discussion in the previous paragraph, it can be seen that the trace back procedure with the transition relationship as shown in FIG. 3 for 16 state Wei's codes can be implemented by the combinational circuit of FIG. 7. The best survivor path as shown in FIG. 6 can be obtained with the combinational logic circuit that comprises an 4-input and 1-output multiplexer, a shifter and a 4 bit full adder. In addition to the simplicity of the combinational logic, the time required to accomplish the trace-back procedure is shorter than the total memory access time required if a ROM is used. Therefore, the present invention not only reduces the gate count of the Viterbi decoder but also increases the trace-back speed.

Figure 1:
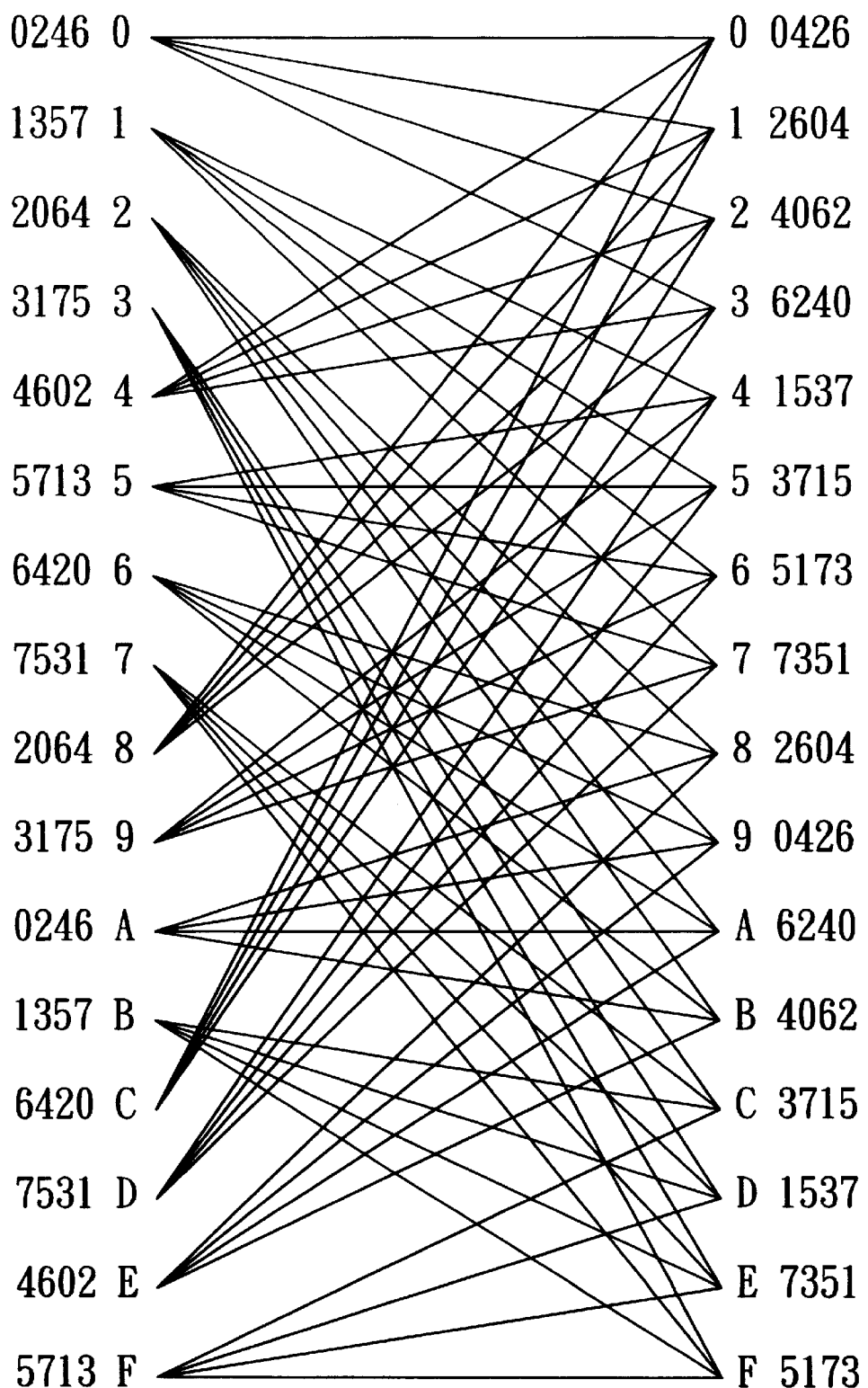
FIG. 1 shows a trellis diagram of 16-state code with 4-D constellation.
Figure 2:
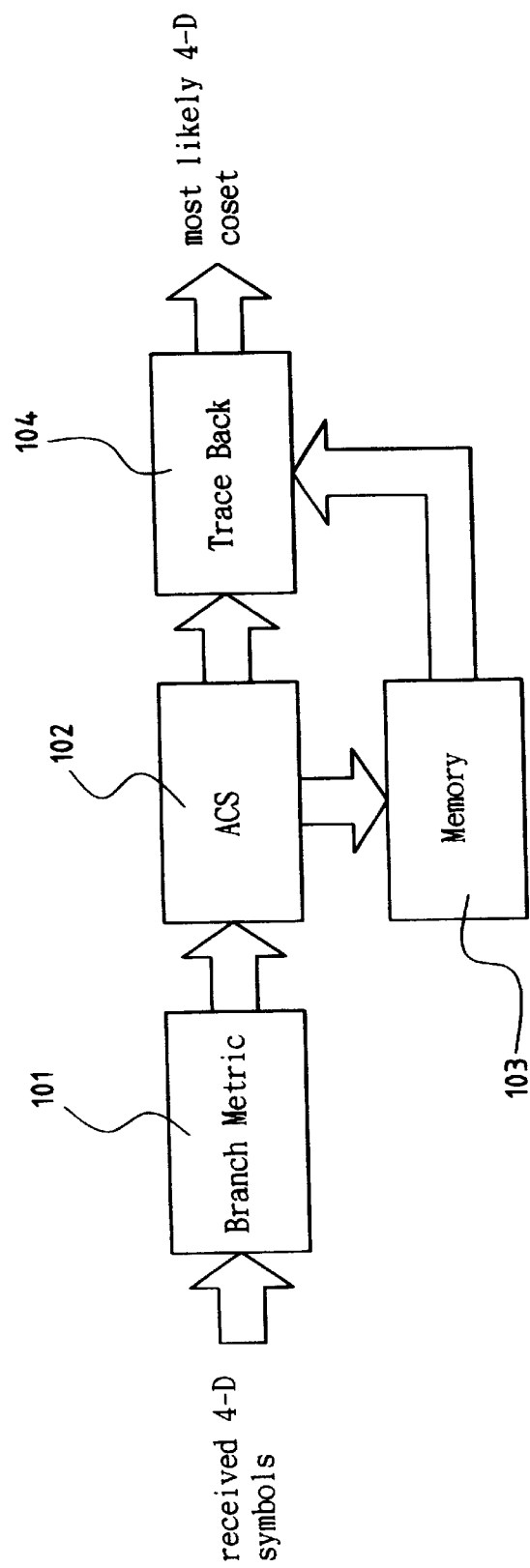
FIG. 2 shows the block diagram of a typical Viterbi decoder using a trace-back method.

As pointed out earlier for a trace-back length of 20, the size of the required memory that stores the surviving 4-D symbols of each state in the memory unit 103 of FIG. 1 is 16×20×8×4 bits in the conventional implementation, and redundant information is stored because the 4-D symbols associated with all state transitions that are selected from the cosets are stored in their original format.

According to another preferred embodiment of this invention, a new memory reduction mechanism is implemented to avoid storing the redundant information and reduce the size of the required memory. As shown in FIG. 8, the 4-D cosets in Wei's code can be rewritten as the union of two Cartesian product of two 2-D cosets in V and W coordinate systems. In the following description, a 4-D coset is represented by $C_4^n$ and a 2-D coset is represented by $C_2^n$.

With reference to FIG. 9, assume that a received 4-D signal is denoted by the two circles indicated in the two coordinate systems V and W respectively. The two 2-D symbols in the coset $C_2^0 \times C_2^0$ that are closest to the received signal are $V_2^0 \times W_2^0$ whose coordinates are given by $(x_v, y_v) \times (x_w, y_w)$. The symbol in each of the eight 4-D cosets that is closest to the received signal is listed in FIG. 10. In other words, all the symbols in the eight 4-D cosets that are closest to the received signal can be represented the symbol $V_2^0 \times W_2^0$ chosen from the coset $C_2^0 \times C_2^0$ along with the differences between their coordinates. Therefore, the size of the memory required for storing the trace-back information is reduced to 20×8×4+20×4×2×16.

Figure 12:
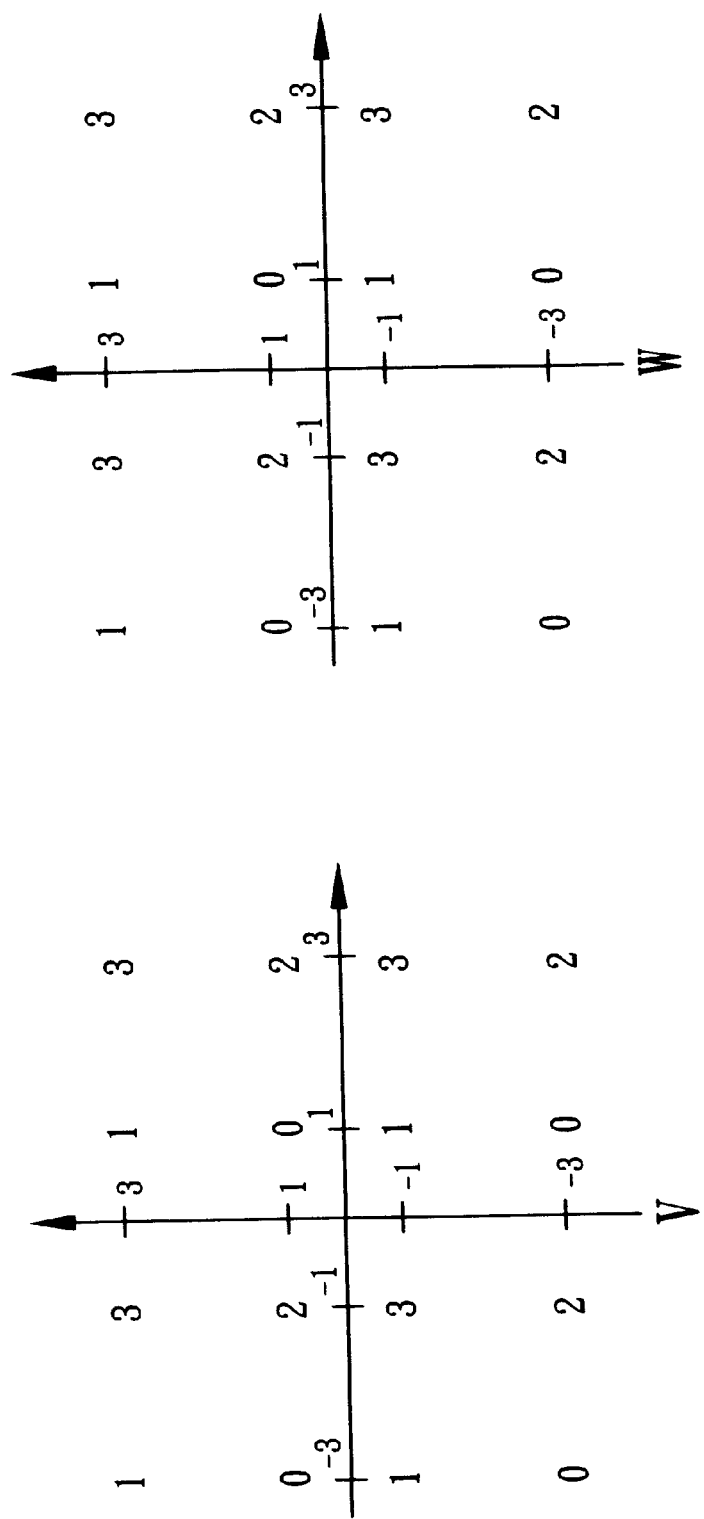
FIG. 12 shows that the 4-D symbols of FIG. 11 consist of two 2-D constellations each with 16 QRAM signal constellation.

To better explain the present invention, a detailed example is given in the following description to illustrate how to get FIG. 4. For illustration purpose without loss of generality, assume that five 4-D symbols as shown in FIG. 11 are received and sent to the Trellis decoder and all these 4-D symbols consist of two 2-D constellations each with 16 QAM signal constellation as shown in FIG. 12.

The labels on each 2-D constellation denote 2-D cosets' number. Thus, a 2-D constellation is divided into four 2-D cosets {0, 1, 2, 3} and signals in a 4-D constellation can be correspondingly divided into sixteen 4-D cosets {(0, 0), (0, 1), (0, 2), (0, 3), (1,0), (1, 1), (1, 2), (1, 3), (2, 0), (2, 1), (2,2), (2, 3), (3, 0), (3, 1), (3,2), (3, 3)}. The sixteen 4-D cosets can be further grouped into eight 4-D cosets as shown in FIG. 8.

The first received 4-D symbol in this example is located at (−3, 3)×(1, 3). The entrance metric associated with a state-to-state transition can be calculated as the square of distance between the received symbol and its closest signal within each 4-D coset that can be associated with the specific state transition. When the first symbol is received at iteration 1, all the entrance metrics of all state transitions are as shown in FIG. 13.

The entrance metric, for example, between the received signal (−3, 3)×(1 ,3) and a closet signal in the 4-D coset $C_2^0 \times C_2^0$, i.e., (−3, 1)×(1, 1) in this case, is 0+4+0+4=8. All the entrance metrics of sixteen original 4-D cosets can thus be obtained in a similar way. The signal with smaller entrance metric within a 4-D coset group shall be chosen as the surviving 4-D symbol for that group. If the entrance metrics in the same group are the same, either one can be chosen.

Figure 14:
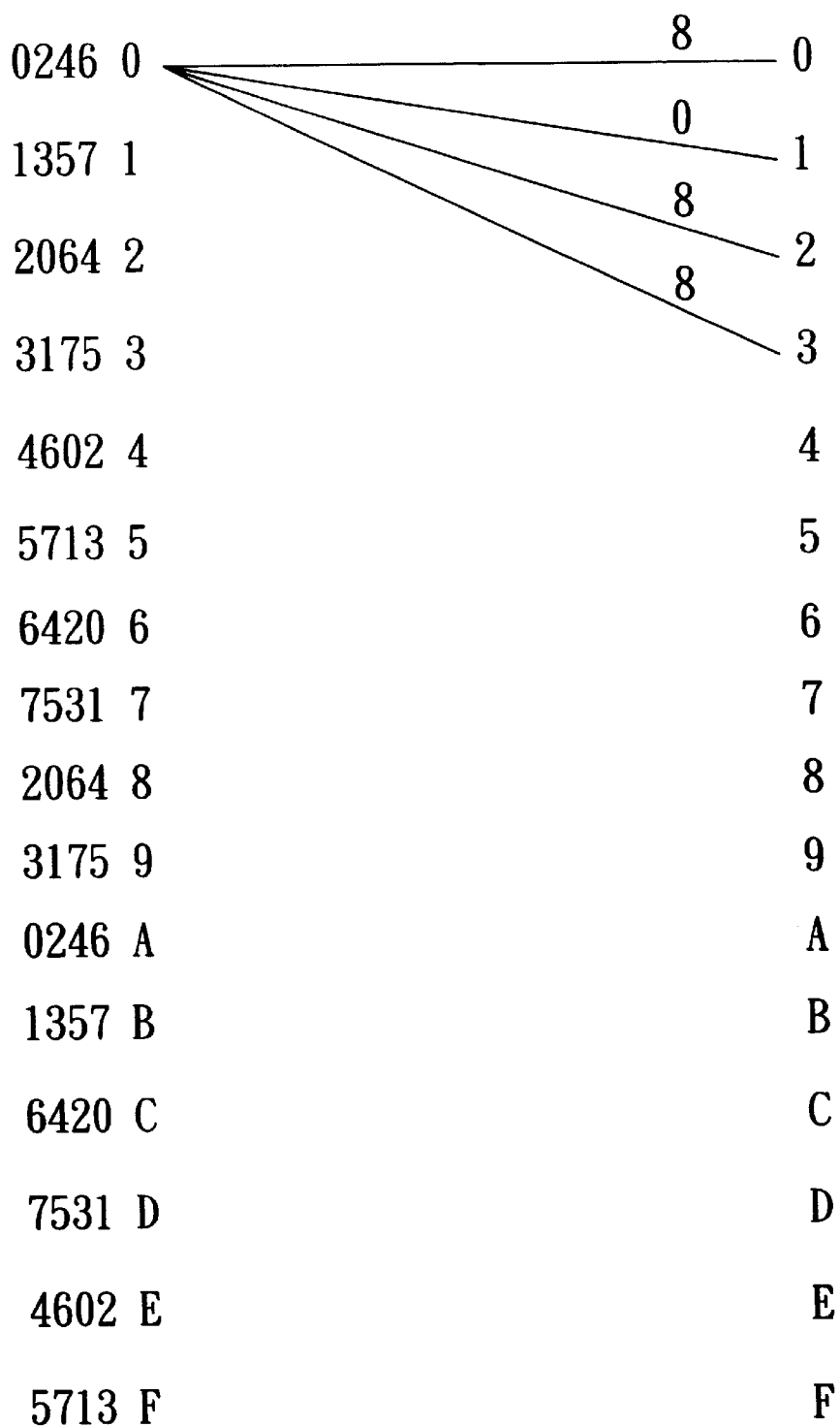
FIG. 14 sows the trellis diagram at iteration 1 for the example of FIG. 11.
Figure 15:
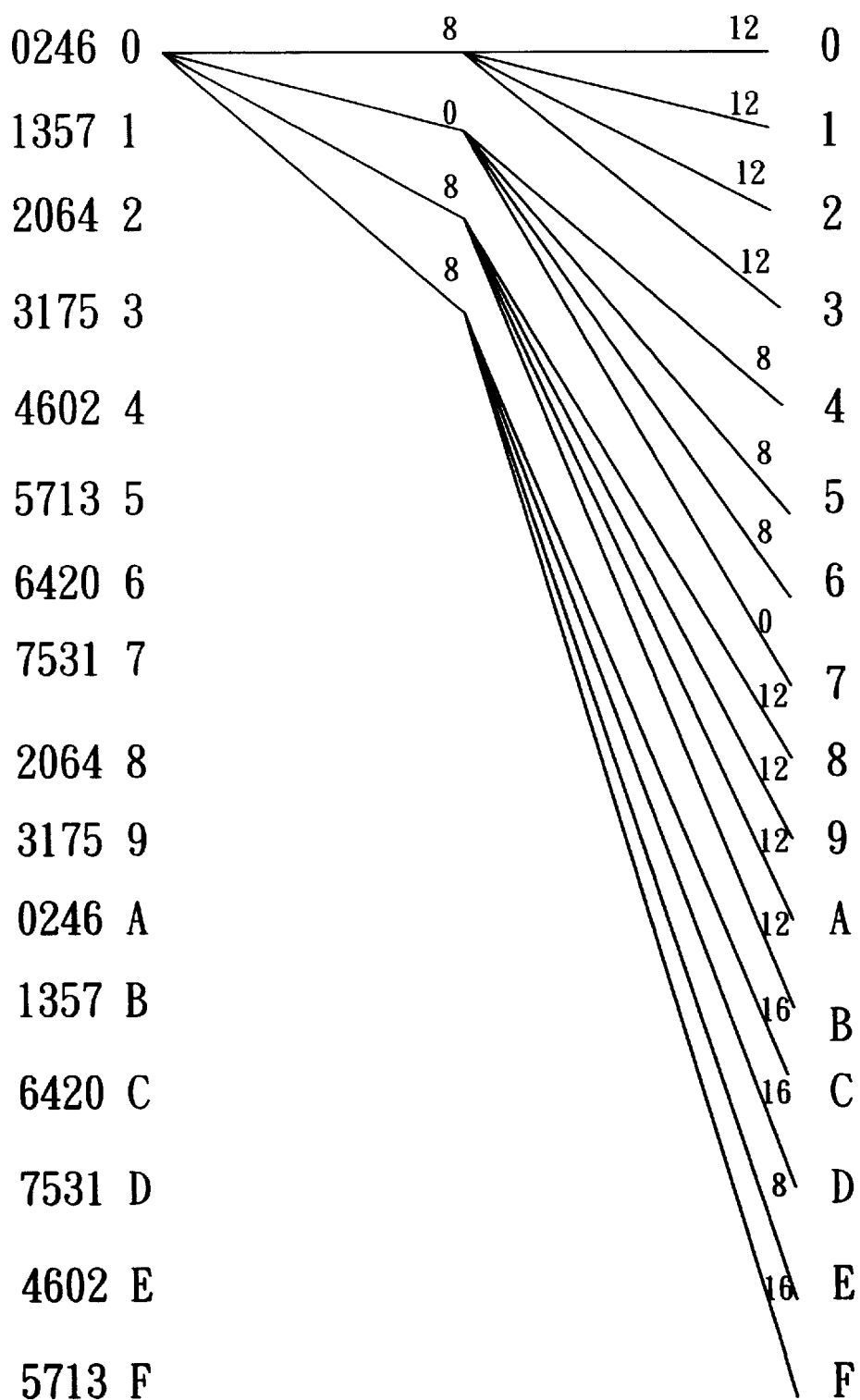
FIG. 15 shows the trellis diagram at iteration 2 for the example of FIG. 11.
Figure 16:
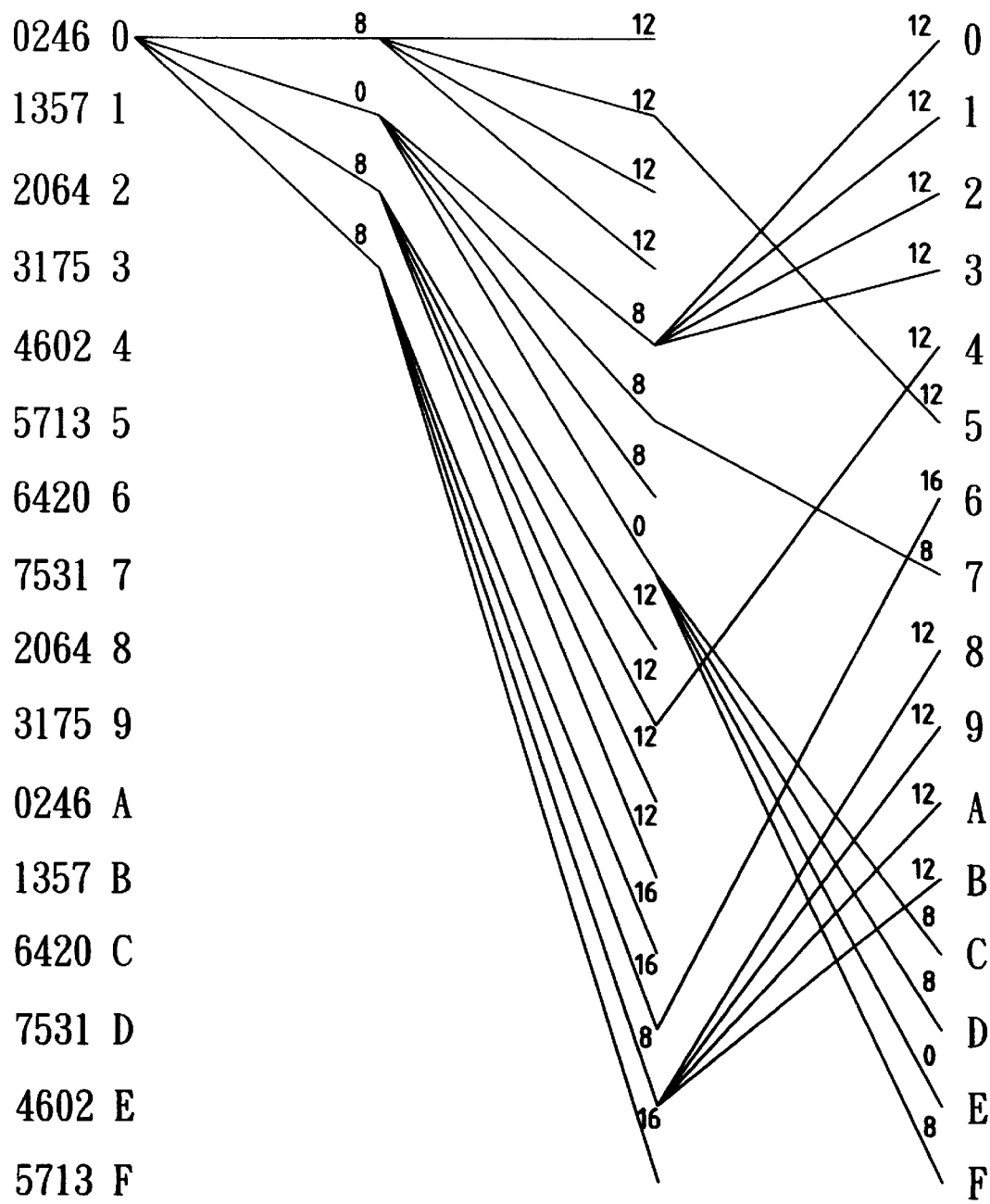
FIG. 16 shows the trellis diagram at iteration 3 for the example of FIG. 11.
Figure 17:
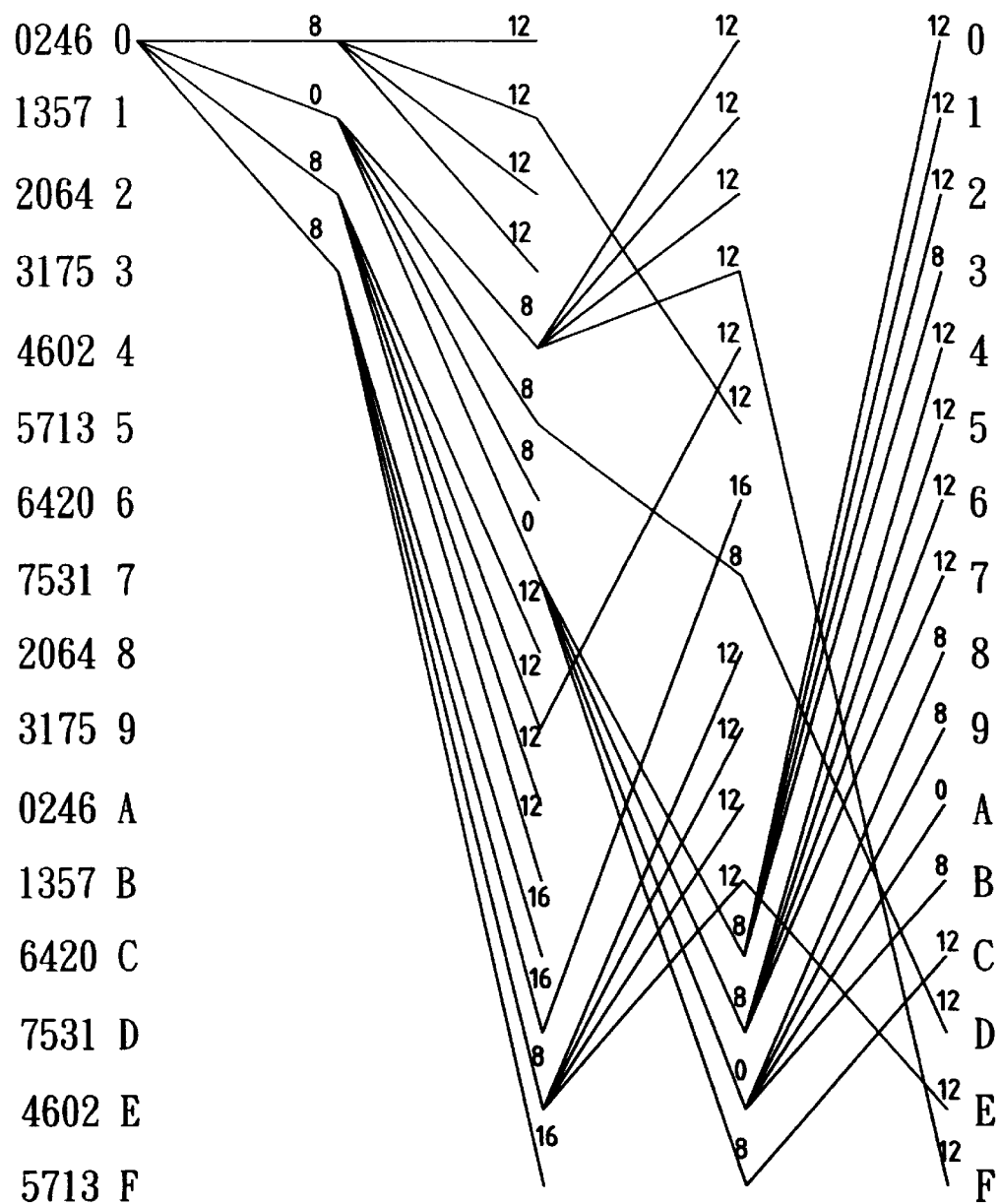
FIG. 17 shows the trellis diagram at iteration 4 for the example of FIG. 11.
Figure 18:
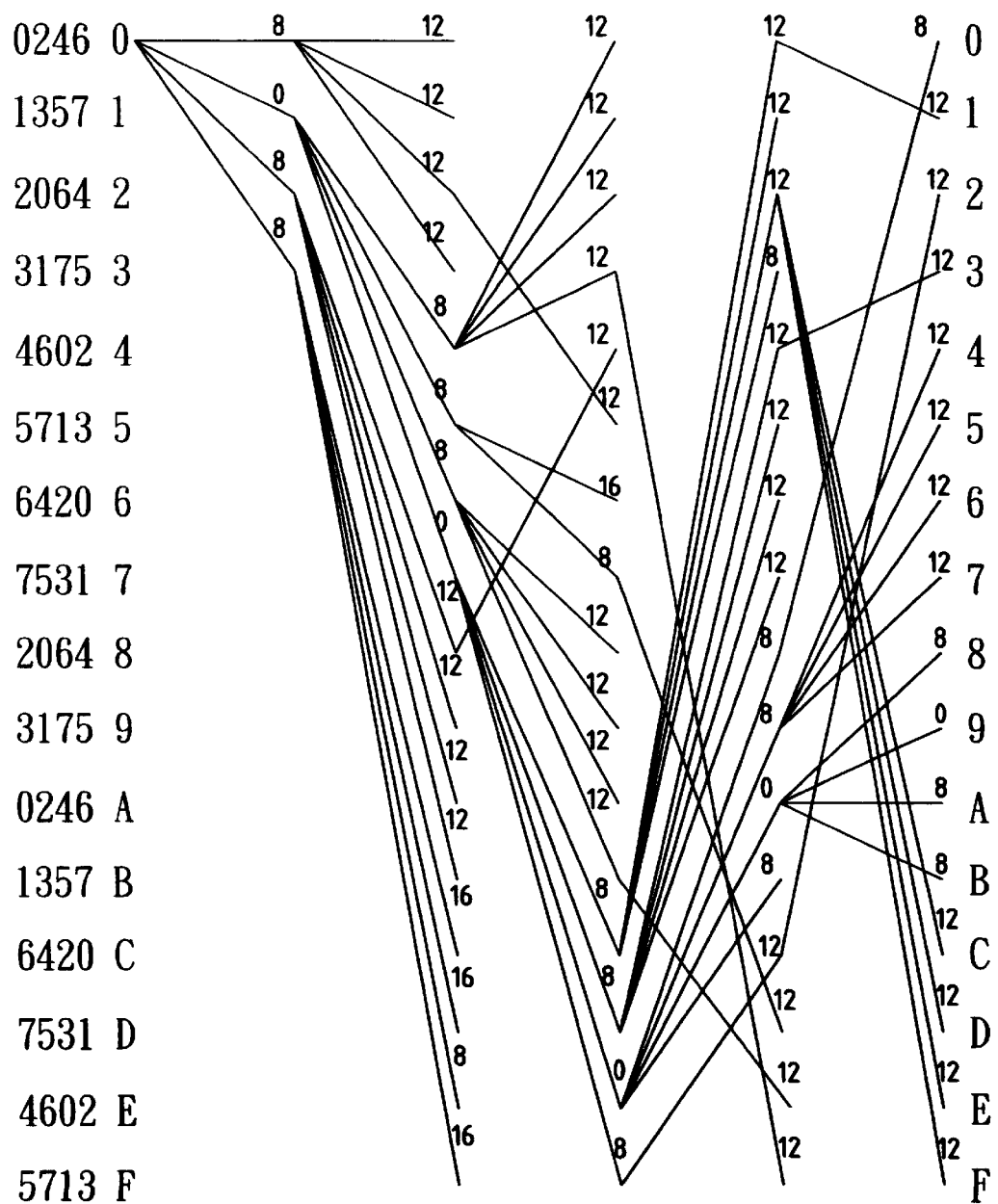
FIG. 18 shows the trellis diagram at iteration 5 for the example of FIG. 11.

In general, the trellis of the received symbols always starts from state 0. The trellis diagram at iteration 1 for the above example is shown in FIG. 14 where the accumulated metrics are denoted by bold letters. After the surviving path associated with each state transition is determined, then, from the state transitions' relationships defined in FIG. 3, trace-back information at iteration 1 is stored as shown in FIG. 4. Although not shown, the 4-D symbols (−3, 1)×(1, 1), (−3, 1)×(3, 3), (−3, 3)×(1, 3) and (−1, 1)×(1, 3) associated with the surviving paths at iteration 1 are also stored.

At iteration 2 and the following iterations, there are always eight distinctive surviving 4-D symbols at each iteration that cover all surviving symbols associated with all possible state transitions at that iteration need to be memorized. Redundant bits, however, appear in storing all those surviving 4-D symbols. According to the second embodiment of this invention, instead of memorizing eight surviving 4-D symbols at each iteration, only a 4-D symbol in $C_2^0 \times C_2^0$, i.e., (−3, 1)×(1, 1) in this example, and locations of the eight surviving 4-D symbols are stored. Instead of saving a surviving 4-D symbol in $C_4^6$, for example, ((−1, 1)×(1, 3)), 8 bit location information ((01, 00)×(00, 01)) relative to (−3, 1)×(1, 1) in $C_2^0 \times C_2^0$ are kept in memory to represent ((−3, 1)×(3, 3)) where 00 denotes the location in a coordinate the same as the first surviving symbol in $C_2^0 \times C_2^0$, 01 in a coordinate denotes a location that is +2 in that coordinate from the surviving one in $C_2^0 \times C_2^0$. The last column of FIG. 13 shows the location information of eight surviving 4-D symbols. Therefore, in an ordinary method, it takes eight bits to store each axis of one 4-D symbols while only two bits are needed to keep all the necessary information according to the second embodiment of the invention.

Figure 19:
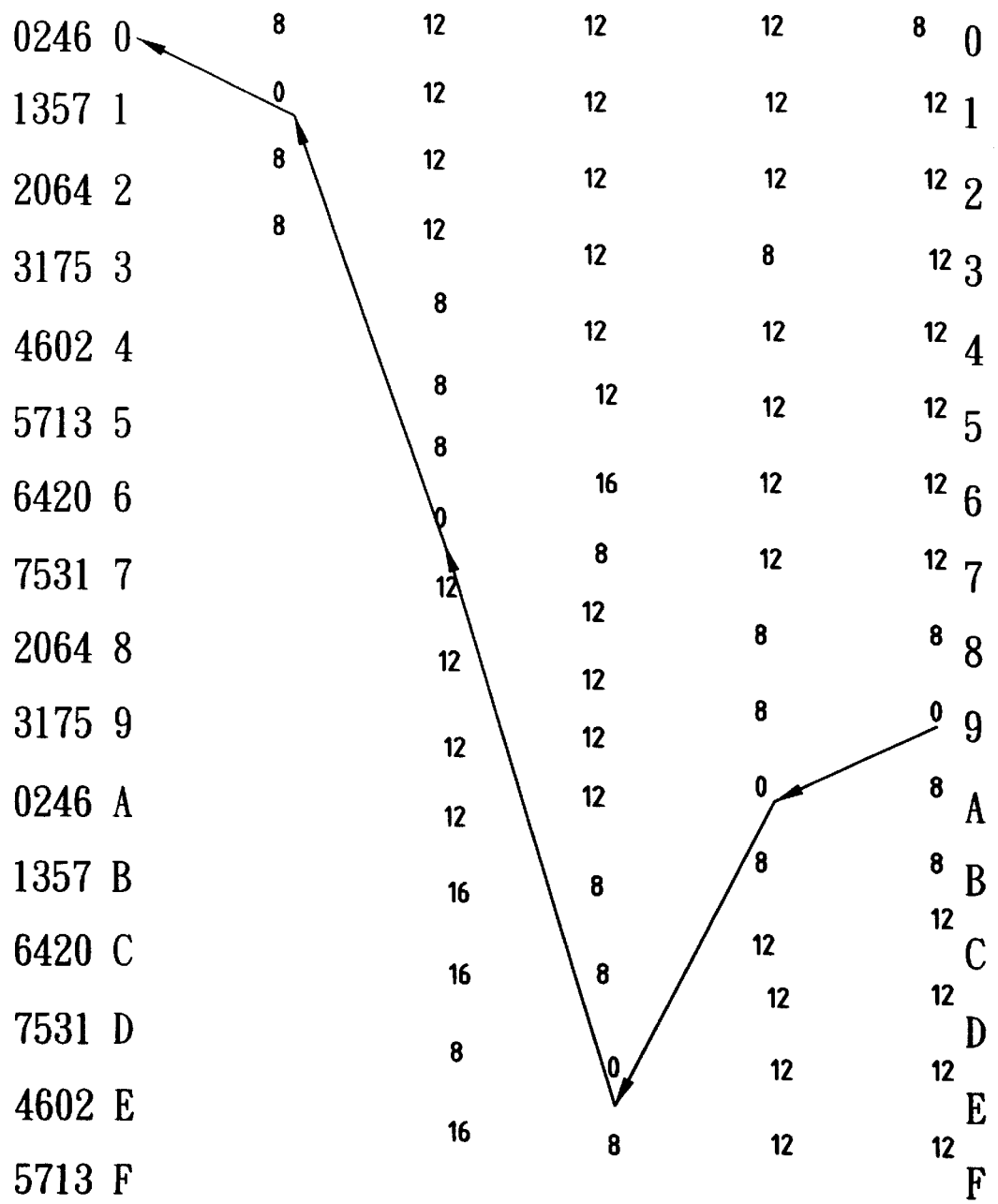
FIG. 19 shows the best surviving path at iteration 5 for the example of FIG. 11.

Trellis at iteration 2, 3, 4 and 5 can be obtained in the same way and the results are shown in FIGS. 15, 16, 17 and 18 separately. The trace-back information can also be obtained as shown respectively in columns 2 to 5 in FIG. 4. The surviving path with the minimum accumulated metrics at iteration 5 is the one entering state 9 as can be found in FIG. 18. Therefore, the trace-back procedure will start from state 9 and has the best surviving path eventually at iteration 5 as that shown in FIG. 19.

Although only the preferred embodiments of this invention were shown and described in the above description, numerous changes in the detailed construction and combination as well as arrangement of parts may be restored to without departing from the spirit or scope of the invention as hereinafter set forth in the appended claims. It is requested that any modification or combination that comes within the spirit of this invention be protected.

What is claimed is:

1. A trace-back processing unit for a Viterbi decoder for tracing a current state to a prior state, comprising a trace-back unit including a shifter for receiving a state value of said current state and generating a shifted state value, a multiplexer having four inputs for receiving trace-back information of said current state and generating a multiplexer output value, and an adder for adding said shifted state value to said multiplexer output value and generating a state value for said prior state, wherein said multiplexer generates 0, 4, 8 and 12 when said trace-back information is 0, 1, 2 and 3 respectively.

2. A trace-back processing unit for a Viterbi decoder for tracing a current state to a prior state, comprising a trace-back unit including a shifter for receiving a state value of said current state and generating a shifted state value, a multiplexer having four inputs for receiving trace-back information of said current state and generating a multiplexer output value, and an adder for adding said shifted state value to said multiplexer output value and generating a state value for said prior state, wherein is the state value of said current state shifted towards right by 2 bits.

3. The trace-back processing unit according to claim 1, said trace-back information including 4-D symbols, each 4-D symbol being represented by two 2-D symbols each having a coordinate, and the difference between the coordinates of the two 2-D symbols.

4. A trace-back method for processing trace-back operation of a Viterbi decoder for tracing a current state to a prior state, comprising the steps of:

generating a trace-back value from trace back information of said current state; generating a shifted state value from a state value of said current state; and adding said trace-back value to said shifted state value for generating a state value of said prior state;

wherein said multiplexer generates 0, 4, 8 and 12 when said trace-back information is 0, 1, 2 and 3 respectively.

5. A trace-back method for processing trace-back operation of a Viterbi decoder for tracing a current state to a prior state, comprising the steps of:

generating a tracback value from trace-back information of said current state;

generating a shifted state value from a state value of said current state; and adding said trace-back value to said shifted state value for generating a state value of said prior state;

wherein said shifted state value is the state value of said current state shifted towards right by 2 bits.

6. The trace-back method according to claim 4, said trace-back information including 4-D symbols, each 4-D symbol being represented by two 2-D symbols each having a coordinate, and the difference between the coordinates of the two 2-D symbols.

* * * * *